(12) United States Patent
Jansen et al.

(10) Patent No.: US 12,007,082 B2
(45) Date of Patent: Jun. 11, 2024

(54) METHOD FOR JOINING FLEXIBLE FOILS COMPRISING LEDS

(71) Applicant: SIGNIFY HOLDING B.V., Eindhoven (NL)

(72) Inventors: Johannes Martinus Jansen, Veldhoven (NL); Marcellus Jacobus Johannes Van Der Lubbe, Best (NL); Peter Henri Backen, Heeze (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/271,099

(22) PCT Filed: Dec. 22, 2021

(86) PCT No.: PCT/EP2021/087372
§ 371 (c)(1),
(2) Date: Jul. 6, 2023

(87) PCT Pub. No.: WO2022/148664
PCT Pub. Date: Jul. 14, 2022

(65) Prior Publication Data
US 2024/0077179 A1    Mar. 7, 2024

(30) Foreign Application Priority Data

Jan. 8, 2021 (EP) .................................. 21150648

(51) Int. Cl.
*F21K 9/90* (2016.01)
*F21S 8/04* (2006.01)
(Continued)

(52) U.S. Cl.
CPC .................. *F21K 9/90* (2013.01); *F21S 8/04* (2013.01); *F21V 23/002* (2013.01);
(Continued)

(58) Field of Classification Search
CPC .. F21K 9/90; F21S 8/04; F21V 23/002; H01L 25/0753; F21Y 2105/16; F21Y 2115/10
See application file for complete search history.

(56) References Cited

U.S. PATENT DOCUMENTS 3,840,842 A  * 10/1974  Gabryelewicz ......... F21V 23/06
                                                          439/639
9,812,831 B2 * 11/2017  Zanotto ................... H01R 11/11
(Continued)

FOREIGN PATENT DOCUMENTS

DE    102013203666 A1    9/2014
DE    102014206882 A1   10/2015
(Continued)

*Primary Examiner* — Mary Ellen Bowman

(57) ABSTRACT

The present invention relates to a method for joining at least two flexible foils (10a-b). The method comprises the steps of (i) providing a first flexible foil (10a) having a first row (12) of light emitting diodes (14) and a first set of electrically conductive tracks (16) for supplying current to the first row (12) of light emitting diodes (14), (ii) providing a second flexible foil (10b) having a pot second row (12) of light emitting diodes (14) and a second set of electrically conductive tracks (16) for supplying current to the second row (12) of light emitting diodes (14), and (iii) joining the first flexible foil (10a) and the second flexible foil (10b) at an overlap (22) of the first flexible foil (10a) and the second flexible foil (10b), wherein a metal strip or wire (24; 24) gets embedded between the first flexible foil (10a) and the second flexible foil (10b) at the overlap, and wherein the metal strip or wire (24; 24) electrically connects to the first and second sets of electrically conductive tracks (16).

15 Claims, 7 Drawing Sheets

(51) Int. Cl.
　　　*F21V 23/00*　　　(2015.01)
　　　*F21Y 105/16*　　(2016.01)
　　　*F21Y 115/10*　　(2016.01)
　　　*H01L 25/075*　　(2006.01)

(52) U.S. Cl.
　　　CPC ...... *H01L 25/0753* (2013.01); *F21Y 2105/16* (2016.08); *F21Y 2115/10* (2016.08)

(56) References Cited

U.S. PATENT DOCUMENTS

| | | | |
|---|---|---|---|
| 10,125,964 B2* | 11/2018 | Camarota | ............... F21V 23/06 |
| 2014/0334142 A1 | 11/2014 | Levante et al. | |
| 2015/0241035 A1* | 8/2015 | Dankelmann | ......... F21V 21/005 |
| | | | 439/725 |

FOREIGN PATENT DOCUMENTS

| | | |
|---|---|---|
| GB | 2543750 A | 5/2017 |
| WO | 2019206457 A1 | 10/2019 |

* cited by examiner

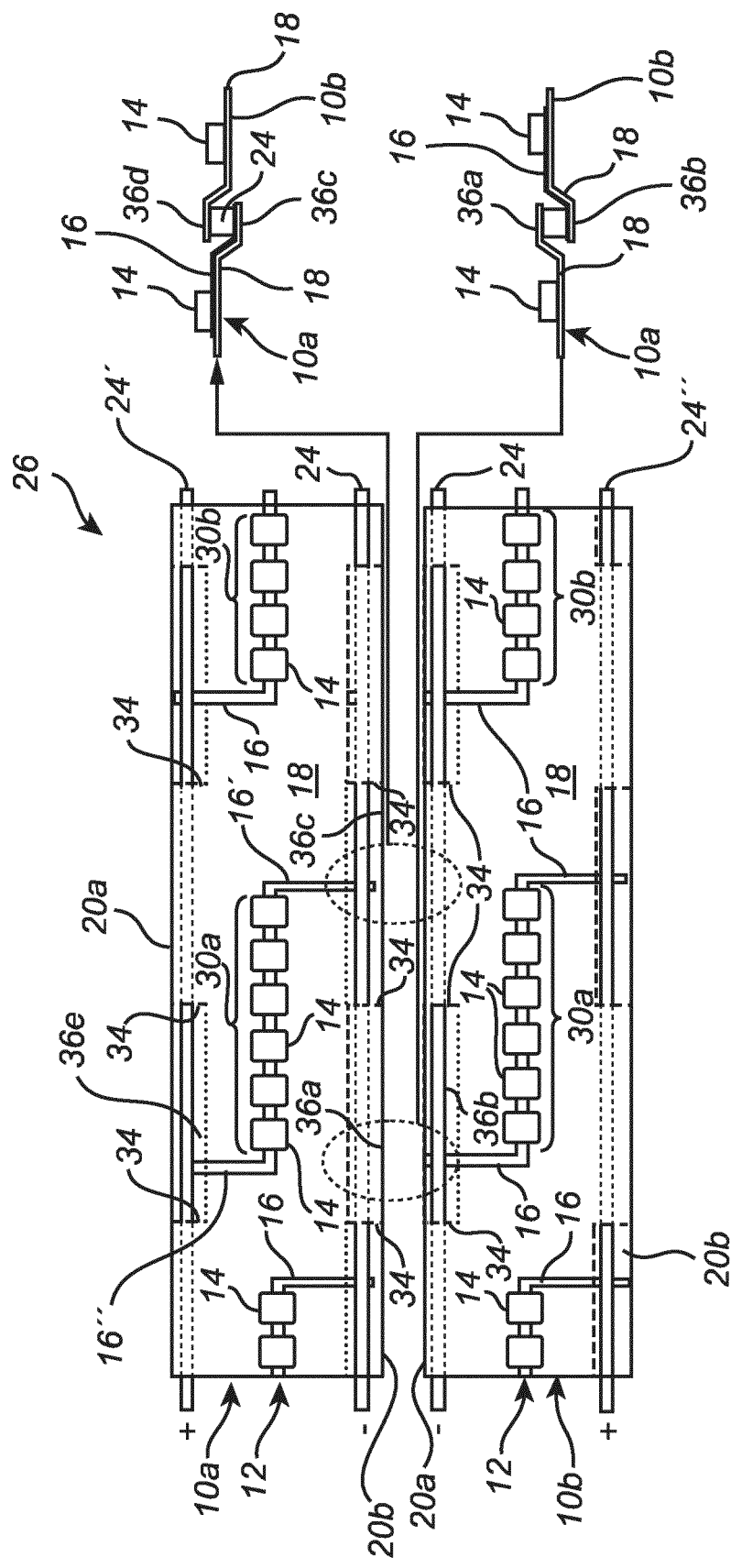

METHOD FOR JOINING FLEXIBLE FOILS COMPRISING LEDS

CROSS-REFERENCE TO PRIOR APPLICATIONS

This application is the U.S. National Phase application under 35 U.S.C. § 371 of International Application No. PCT/EP2021/087372, filed on Dec. 22, 2021, which claims the benefit of European Patent Application No. 21150648.0, filed on Jan. 8, 2021. These applications are hereby incorporated by reference herein.

FIELD OF THE INVENTION

The present invention relates to a method for joining at least two flexible foils. The present invention also relates to a flexible foil device comprising at least two flexible foils joined by such a method.

BACKGROUND OF THE INVENTION

Flex(ible) foils can generally be made from polyethylene terephthalate (PET)/polyethylene naphthalate (PEN) or polyimide (PI), depending on the application. Joining technologies for PET/PEN or PI are generally known to be by mechanical fasteners, self-assembly, adhesive bonding, or by heat welding. Heat welding particularly can be done by thermode, ultrasonic, or other ways where heat is used.

Within flex foil technology wherein the foil comprises a plurality of light emitting diodes (LEDs), the maximum foil width that can be used in industry is approximately 40 cm. For large area application this is too small, so flex foils must be joined one way or another. Large area applications could for example be Philips Large Luminous Surfaces, such as OneSpace Luminous Ceiling and OneSpace Prefab. OneSpace Prefab could for example have a width of 1800 mm and a length of 3000 mm.

Furthermore, due to the large area application, through long(er) lengths, the resistance of the electrical tracks on the foil supplying current to the LEDs will cause a voltage drop (I R), this voltage drop will cause a lumen drop and efficiency loss.

DE102014206882 discloses a flexible area lighting body having a surface distributed plurality of lighting means on a flat support material. The flat support material has at least two layers. A first layer is designed as a flexible planar circuit carrier, which is equipped on a front side with the plurality of light sources. A second layer is formed as a flexible planar cooling layer and is connected to the circuit carrier (30) at its front side opposite the rear.

SUMMARY OF THE INVENTION

It is an object of the present invention to provide a method for joining at least two flexible foils which at the same time overcomes or at least alleviates the aforementioned problem of voltage drop in the length direction.

According to a first aspect of the invention, this and other objects are achieved by a method for joining at least two flexible foils. The method comprises the steps of (i) providing a first flexible foil having a first row of light emitting diodes and a first set of electrically conductive tracks for supplying current to the first row of light emitting diodes, (ii) providing a second flexible foil having a second row of light emitting diodes and a second set of electrically conductive tracks for supplying current to the second row of light emitting diodes, and (iii) joining the first flexible foil and the second flexible foil at an overlap of the first flexible foil and the second flexible foil, wherein a metal strip or wire gets embedded between the first flexible foil and the second flexible foil at the overlap, and wherein the metal strip or wire electrically connects to the first and second sets of electrically conductive tracks.

The present invention is based on the understanding when foils need to be joined anyhow, one can apply a metal strip, or wire in between the foils to be joined, which metal strip/wire can be used as a busbar for long LED foils. The busbar may prevent or at least minimise current loss over long length, whereby voltage drop in the length direction can be minimized. Furthermore, since the metal strip or wire becomes embedded, it cannot be touched directly by a person, whereby safety is improved.

Joining the first flexible foil and the second flexible foil at an overlap of the first and second flexible foils, wherein a metal strip or wire is embedded between the first and second flexible foils at the overlap, may include placing the metal strip or wire between the first flexible foil and the second flexible foil, and using an apparatus to melt together the first flexible foil and the second flexible foil at the overlap to form a solid connection.

Furthermore, placing the metal strip or wire between the first flexible foil and the second flexible foil may include pushing the metal strip or wire in between the first and second flexible foils as they move past said apparatus.

The apparatus may be a high frequency (HF) coil, wherein the high frequency coil is used for introducing an eddy current in the metal strip or wire to heat the metal strip or wire, and wherein the heated metal strip or wire melts together the first flexible foil and the second flexible foil at the overlap.

The first and second flexible foils may move past the apparatus/high frequency coil at an even speed in the range of 2-4 m/min (depending on the thermal conductivity of the metal used). Furthermore, an induction generator setting of the high frequency coil may be in the range of 0.5-1.5 kVA with a frequency of about 0.55 and 1.0 MHz. The above beneficially provides for a continuous assembly process.

The method may further comprise, after melting, forming the first flexible foil and the second flexible foil over the metal strip or wire. This may ensure that the metal strip or wire indeed gets embedded/insulated, and/or add strength.

Instead of a high frequency coil, the aforementioned apparatus could be a thermode or ultrasonic welding apparatus or any other heating joining apparatus. Even hot melt adhesive or glue could be used. Batch processing or reel to reel processing is possible too.

Each of the first and second rows of light emitting diodes may extend in a longitudinal direction of the first and second flexible foils, respectively, wherein the first and second flexible foils are joined at longitudinal overlapping edge portions thereof. Preferably, the longitudinal overlapping edge portions have cuts forming flaps, wherein the metal strip or wire is placed between the first and second flexible foils are such that a flap of the first flexible foil is above the metal strip or wire, the opposite flap of the second flexible foil is below the metal strip or wire, the longitudinally subsequent flap of the first flexible foil is below the metal strip or wire, the flap of the second flexible foil opposite the longitudinally subsequent flap of the first flexible foil is above the metal strip or wire, and so on. Hence an "interleaved" or alternating structure may be achieved, which may facilitate the electrical connections. Specifically, this enables electrical connection to the strip or wire directly to the electrically conductive tracks on both foils. The flaps should be cut beforehand, and while inserting the strip or wire, the flaps should be subsequently positioned above and below the strip. This assembly can then be joined with any of the aforementioned techniques.

Each of the first and second flexible foils may have a width in the range of 20-60 cm, such as about 40 cm (present industry standard). Furthermore, each of the first and second flexible foils may have a length in the range of 0.5-30 m. For certain applications like a tunnel, a corridor, high facades, etc., the length could be up to 100 m.

Each of the first and second flexible foils may include a substrate made of plastic, such as polyethylene terephthalate (PET) or polyethylene naphthalate (PEN) or polyethylene (PE) or polyimide (PI).

The light emitting diodes of each of the first and second flexible foils may comprise at least at least two groups of light emitting diodes, each group comprising at least one light emitting diode (3V) or at least two light emitting diodes connected in series, wherein each group is electrically connected to said metal strip or wire and to a further strip or wire at an opposite longitudinal edge portion of the respective flexible foil.

In reel to reel processing, a long foil is cut at a certain length to form the first and second flexible foils to be joined. However, every other flexible foil may have to be rotated by 180° to take care for the polarity of the metal strip or wire (busbar) and the direction of the current through the light emitting diodes. This may be quite disturbing in a flow process. To this end, alternatively, additional diodes may be incorporated in the circuit, and this facilitates producing a flexible foil device LED in reel to reel process. Specifically, the light emitting diodes of the first and second flexible foils may be arranged in the same direction by means of additional diodes arranged to direct the electrical current into the right direction.

The metal strip or wire may have a greater cross-section than said electrically conductive tracks. By this, the metal strip or wire adds structure to the foil. Either to enable spanning the resulting flexible foil device over a long length or to bend it in a stable way, to create defined shapes, like waves.

Preferably, the electrically conductive tracks are printed silver circuitry, and the metal strip or wire is made of copper. However, the electrically conductive tracks could basically be any conductive track material, like copper, printed silver circuitry, aluminium, etc., and the metal strip or wire could be made of any high conductive material like copper, aluminium, etc.

According to a second aspect of the invention, there is provided a flexible foil device comprising at least two flexible foils joined by the method according to the first aspect. The flexible foil device may comprise more than two joined flexible foils, and for all joints a busbar can be foreseen.

According to a third aspect of the present invention, there is provided a flexible foil device comprising a first flexible foil having a first row of light emitting diodes and a first set of electrically conductive tracks for supplying current to the first row of light emitting diodes, and a second flexible foil having a second row of light emitting diodes and a second set of electrically conductive tracks for supplying current to the second row of light emitting diodes, wherein the first flexible foil and the second flexible foil are joined at an overlap of the first flexible foil and the second flexible foil, wherein a metal strip or wire is embedded between the first flexible foil and the second flexible foil at the overlap, and wherein the metal strip or wire is electrically connected to the first an second sets of electrically conductive tracks. This aspect may have the same or similar features and technical effects as any of the previous aspects, and vice versa.

According to a fourth aspect of the present invention, there is provided a lighting panel comprising a flexible foil device according to the second or third aspect. The lighting panel may for example be a ceiling panel or a luminous textile panel.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIGS. 2a-c schematically illustrate a method according to the present invention, wherein FIG. 2b is a side view, and FIGS. 2a and 2c are cross sectional views.

FIGS. 3a-c are top views of flexible foil devices according to the present invention.

As illustrated in the figures, the sizes of layers and regions may be exaggerated for illustrative purposes and, thus, are provided to illustrate the general structures of embodiments of the present invention. Like reference numerals refer to like elements throughout.

DETAILED DESCRIPTION OF THE EMBODIMENT

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
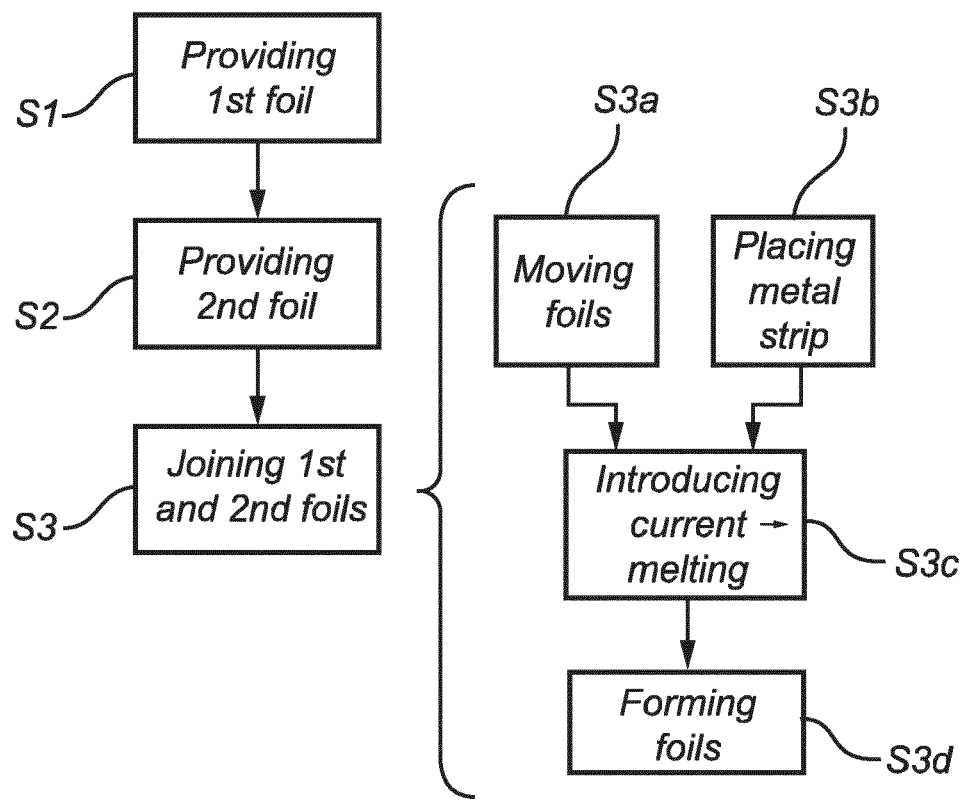
FIG. 1 is a flow chart of a method according to the present invention.

FIG. 1 is a flow chart of a method for joining at least two flexible foils according to one or more embodiments of the present invention.

At S1, the method comprises providing a first flexible foil 10a. With further reference to FIGS. 2-4, the first flexible foil 10a comprises a first (straight) row 12 of light emitting diodes (LEDs) 14 and a first set of electrically conductive tracks 16 for supplying (electrical) current to the first row 12 of LEDs 14. The first flexible foil 10a may for example comprise 2-8 (parallel) rows of LEDs 14. The LEDs 14 may be mounted on a substrate 18 of the first flexible foil 10a. The substrate 18 can be made of plastic, such as PET, PEN, PE, or PI. The electrically conductive tracks 16 may be printed silver circuitry. The first flexible foil 10a may for example have a width W in the range of 20-60 cm, such as 40 cm, and a length L in the range of 0.5-100 m. The first row 12 of LEDs 14 may extend in a longitudinal direction, and the first flexible foil 10a may have (parallel) longitudinal edge portions 20a-b. The LEDs 14 may for example be white LEDs adapted to emit (warm and/or cool) white light. The LEDs 14 may also be RGB LEDs, or a combination of white and RGB LEDs. The first flexible foil 10a may be provided by cutting a longer foil at a certain length (reel to reel processing).

At S2, the method comprises providing a second flexible foil 10b. The second flexible foil 10b comprises a second row 12 of LEDs 14 and a second set of electrically conductive tracks 16 for supplying (electrical) current to the second row 12 of LEDs 14. The second flexible foil 10b may for example comprise 2-8 (parallel) rows of LEDs 14. The LEDs 14 may be mounted on a substrate 18 of the second flexible foil 10b. The substrate 18 can be made of plastic, such as PET, PEN, PE, or PI. The electrically conductive tracks 16 may be printed silver circuitry. The second flexible foil 10b may for example have a width W in the range of 20-60 cm, such as 40 cm, and a length L in the range of 0.5-100 m. The second row 12 of LEDs 14 may extend in a longitudinal direction, and the second flexible foil 10b may have (parallel) longitudinal edge portions 20a-b. The LEDs 14 may for example be white LEDs adapted to emit (warm and/or cool) white light. The LEDs 14 may also be RGB LEDs, or a combination of white and RGB LEDs. The second flexible foil 10b may be provided by cutting the aforementioned longer foil at the certain length (reel to reel processing). As such, the second flexible foil 10b may be substantially identical to the first flexible foil 10a.

At S3, the method comprises joining the first and second flexible foils 10a-b at an overlap 22 of the first and second flexible foils 10a-b, wherein a metal strip or wire 24 is embedded between the first and second flexible foils 10a-b at the overlap 22. The metal strip or wire 24 electrically connects to the first and second sets of electrically conductive tracks 16 of the first and second flexible foils 10a-b, either directly (metal-metal contact) or via a connector or solder or thin metal foil. The resulting product may be referred to as a flexible foil device 26. The overlap 22 may be longitudinal edge portion 20b of the first flexible foil 10a overlapping longitudinal edge portion 20a of the second flexible foil 10b. The metal strip or wire 24 may have substantially the same length as the first and second flexible foils 10a-b. The metal strip or wire 24 should have a greater cross-section than the electrically conductive tracks 16. The cross-section (area) of the metal strip or wire 24 is preferably 10-500 times greater than the cross-section of the electrically conductive tracks 16. The metal strip or wire 24 is preferably made of copper.

The metal strip/wire 24 can advantageously be used as a busbar for long flexible foil devices. The busbar may prevent or at least minimise voltage drop over long length, whereby lumen drop in the length direction can be minimized. Furthermore, since the metal strip or wire 24 is embedded, it cannot be touched directly by a person, whereby safety is improved.

Figure 2A:
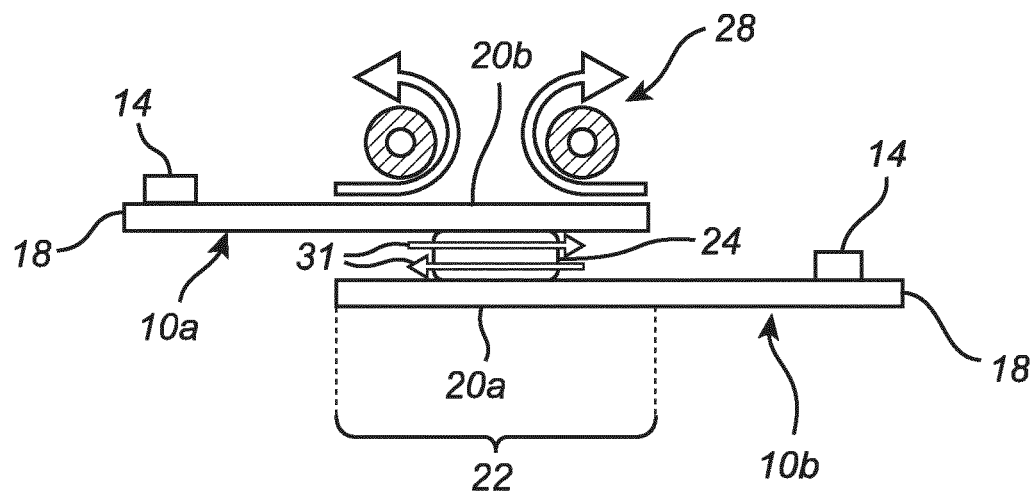
Figure 2B:
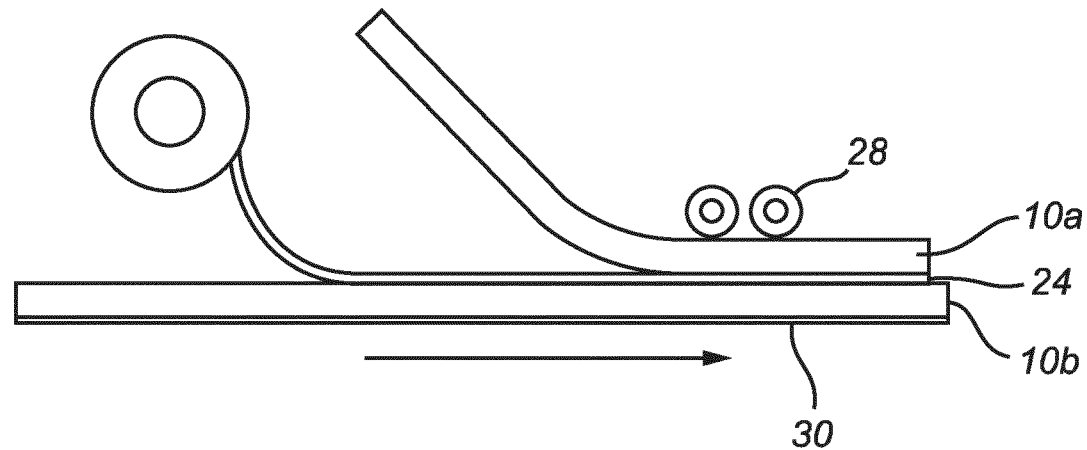
Figure 2C:
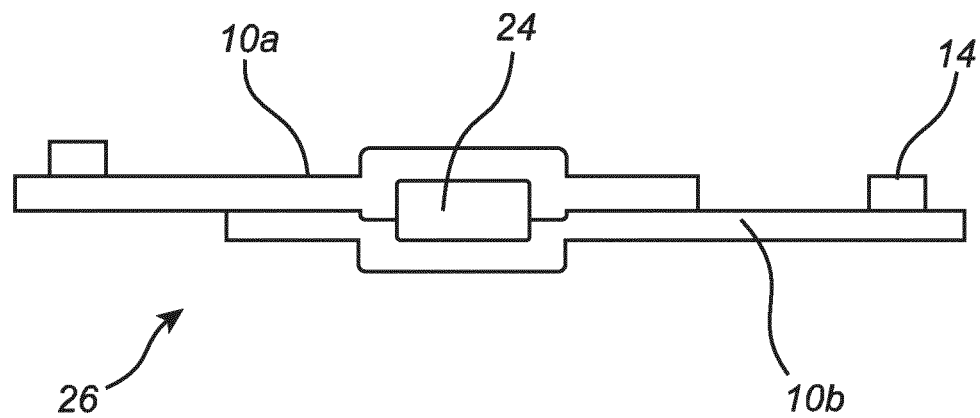

According to an embodiment illustrated in FIGS. 2a-c, the first and second flexible foils 10a-b may be joined using a HF coil 28. The HF coil 28 may be positioned at a fixed distance over a surface 30. The first and second flexible foils 10a-b (arranged with the longitudinal edge portions 20a-b overlapping as mentioned above and shown in FIG. 2a) may be moved in the longitudinal direction under the HF coil 28 at S3a. At the same time, the metal strip or wire 24 may be placed between the first flexible foil 10a and the second flexible foil 10b at S3b. Specifically, the metal strip or wire 24 may be pushed in between the first and second flexible foils 10a-b as they move past the HF coil 28, as shown in FIG. 2b. At S3c, an eddy current 31 may be introduced in the metal strip or wire 24 using the HF coil 28, as shown in FIG. 2a, to heat the metal strip or wire 24. The heated metal strip or wire 24 melts together the first and second flexible foils 10a-b at the overlap 22, to embed the metal strip or wire 24 and form a solid connection, as shown finally in FIG. 2c. After melting, the first and second flexible foils 10a-b could be formed over the metal strip or wire 24, at S3d. The first and second flexible foils 10a-b may move past the HF coil 28 at an even speed, for example in the range of 2-4 m/min. Furthermore, an induction generator setting of the HF coil 28 may be in the range of 0.5-1.5 kVA with a frequency of about 0.55 and 1.0 MHz. In other embodiments, the process shown in FIGS. 2a-c could be executed also by thermode or ultrasonic.

Figure 3A:
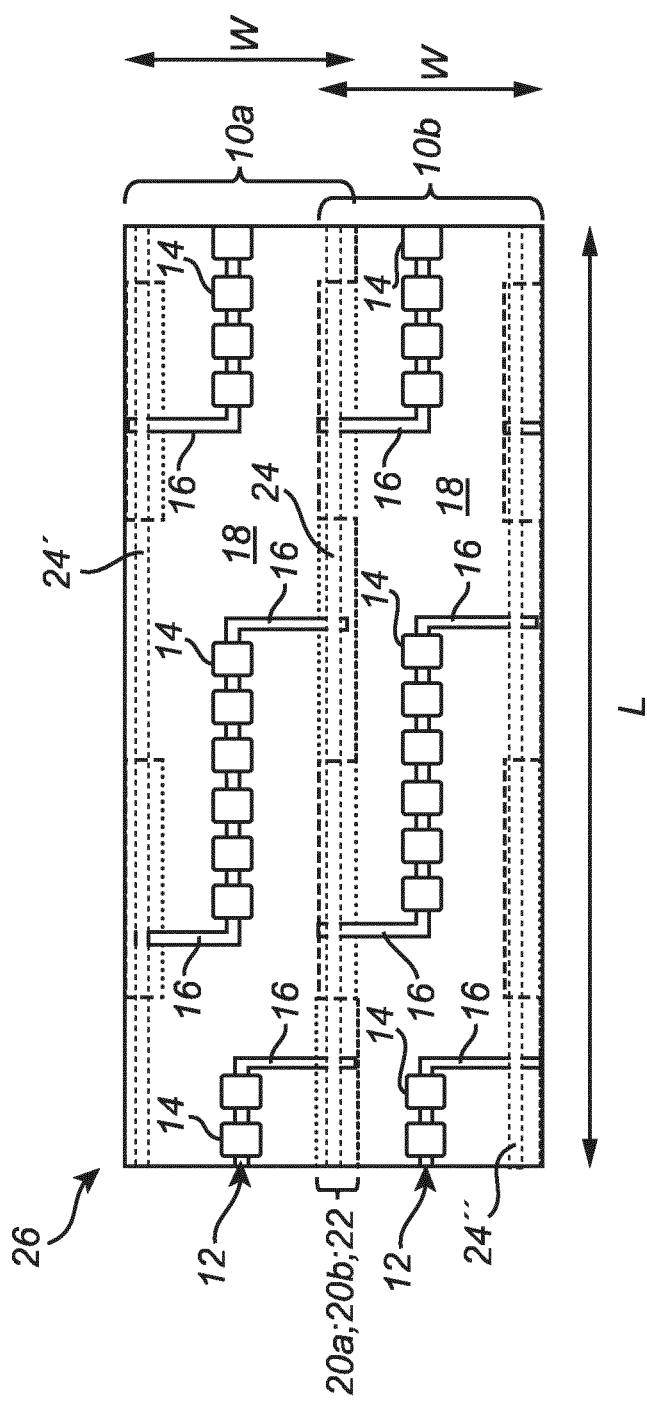

Turning to FIGS. 3a and 3b, these drawings shows an exemplary resulting flexible foil device 26 in more detail. For understanding the way the first and second flexible foils 10a-b are (electrically) connected to each other and to the metal strip or wire 24, the two foils in FIG. 3b are separated, and the cross sections to the right show in detail the local electrical connections. In FIGS. 3a and 3b, the LEDs 14 of each of the first and second flexible foils 10a-b comprises at least at least two groups 30a-b of LEDs 14. Each group 30a-b may comprise at least two, here six, LEDs 14 connected in series. One end of each group 30a-b is electrically connected via an electrically conductive track of the tracks 16 to the metal strip or wire 24. The opposite end of each group 30a-b is electrically connected to a further metal strip or wire at the opposite longitudinal edge portion flexible foil. Namely, the opposite end of each group 30a-b of the first flexible foil 10a is electrically connected to a further metal strip or wire 24' at the opposite longitudinal edge portion 20a, and the opposite end of each group 30a-b of the second flexible foil 10b is electrically connected to a further metal strip or wire 24" at the opposite longitudinal edge portion 20b.

Figure 4A:
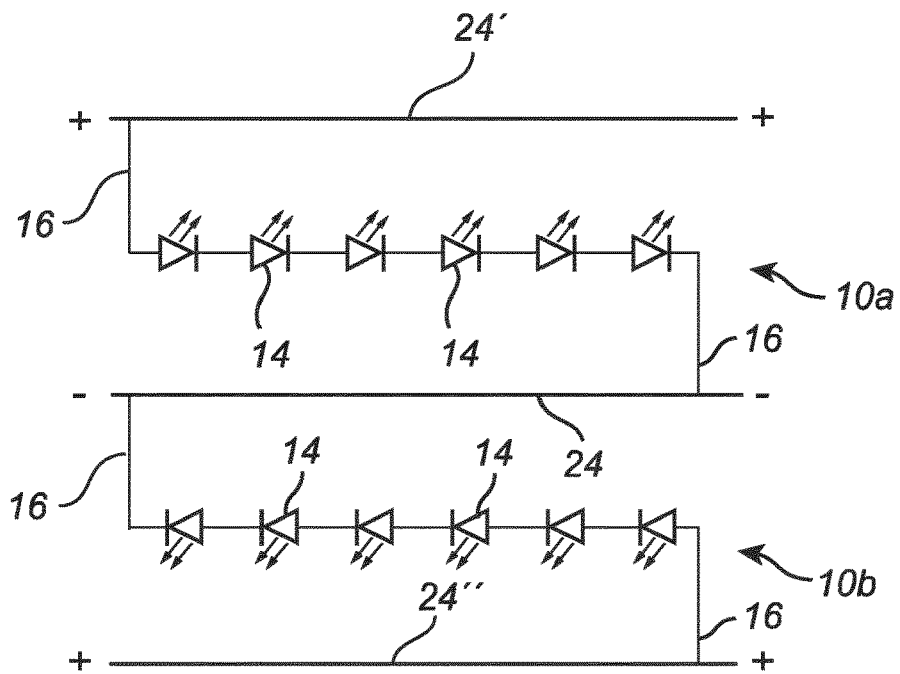
FIGS. 4a-b are circuit diagrams for flexible foil devices according to the present invention.

FIG. 4a shows an exemplary circuitry for the flexible foil device 26 of FIGS. 3a-b. In FIGS. 3a-b, the LEDs 14 of the first flexible foil device 10a are arranged in a first "electrical" direction, and the LEDs 14 of the second flexible foil device 10b are arranged in a second opposite "electrical" direction. That is, the polarities are in opposite directions.

Figure 4B:
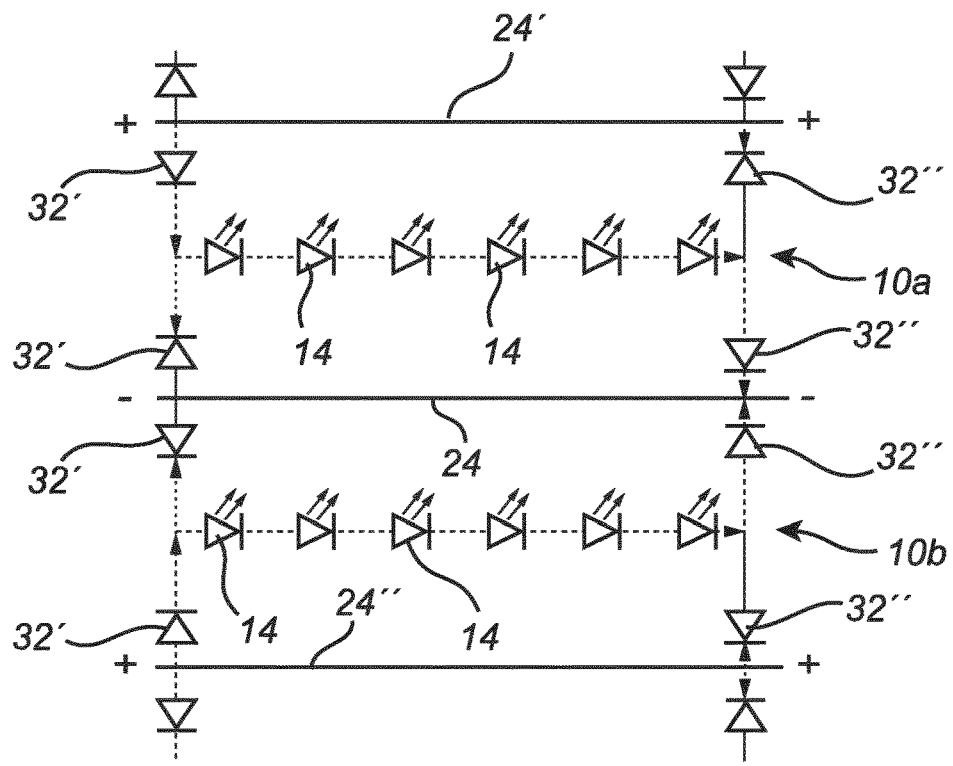

FIG. 4b shows an alternative circuitry for the flexible foil device 26 of FIGS. 3a-b, wherein additional diodes 32' and 32" are incorporated, such the light emitting diodes 14 of both the first and the second flexible foils 10a-b can be arranged in the same "electrical" direction. Specifically, each end of each group 30a-b is electrically connected to both "its" metal strips or wires (for example 24 and 24' for the first flexible foil 10a), like an H. Oppositely oriented additional diodes 32' are connected with their cathodes to the positive/anode end of the group and with their anodes to the positive (+) metal strip/wire and the negative (—) metal strip/wire, respectively, as seen in FIG. 4b. Oppositely oriented additional diodes 32" are connected with their anodes to the negative/cathode end of the group and with their catodes to the + metal strip/wire and the − metal strip/wire, respectively, as also seen in FIG. 4b. Dashed lines/arrows indicate electrical current, and dotted lines/arrows indicate no current; diode does not conduct reverse current. The additional diodes 32' and 32" hence directs the current in the right direction and prevents short cuts from the + metal strip or wire (e.g. 24') to the − metal strip or wire (e.g. 24).

Returning to FIGS. 3a-b, before melting, the longitudinal overlapping edge portions 20a-b may have cuts 34 forming rectangular elongated flaps. The metal strip or wire 24 may be placed between the first and second flexible foils 10a-b such that a flap 36a of the first flexible foil 10a is above the metal strip or wire 24, meaning that the metal strip or wire 24 here is on the opposite side of the substrate 18 of the first flexible foil 10a compared to the LEDs 14 of the first flexible foil 10a. The flap 36b of the second flexible foil 10b opposite flap 36a is below the metal strip or wire 24, meaning that the metal strip or wire 24 here is on the same side of the substrate 18 of the second flexible foil 10b compared to the LEDs 14 of the second flexible foil 10b. Furthermore, the longitudinally subsequent flap 36c of the first flexible foil 10a is below the metal strip or wire 24, the flap 36d of the second flexible foil 10b opposite the longitudinally subsequent flap 36c is above the metal strip or wire 24, and so on. Furthermore, the electrically conductive tracks 16 connect to the metal strip or wire 24 (or 24' or 24") at flaps being below the metal strip or wire 24. For example, the track 16' connecting one end of group 30a of the first flexible foil 10a contacts the metal strip or wire 24 at flap 36c, and the track 16" connecting the other end of that group contacts the metal strip or wire 24' at flap 36e, as shown in FIG. 3b.

Figure 3C:
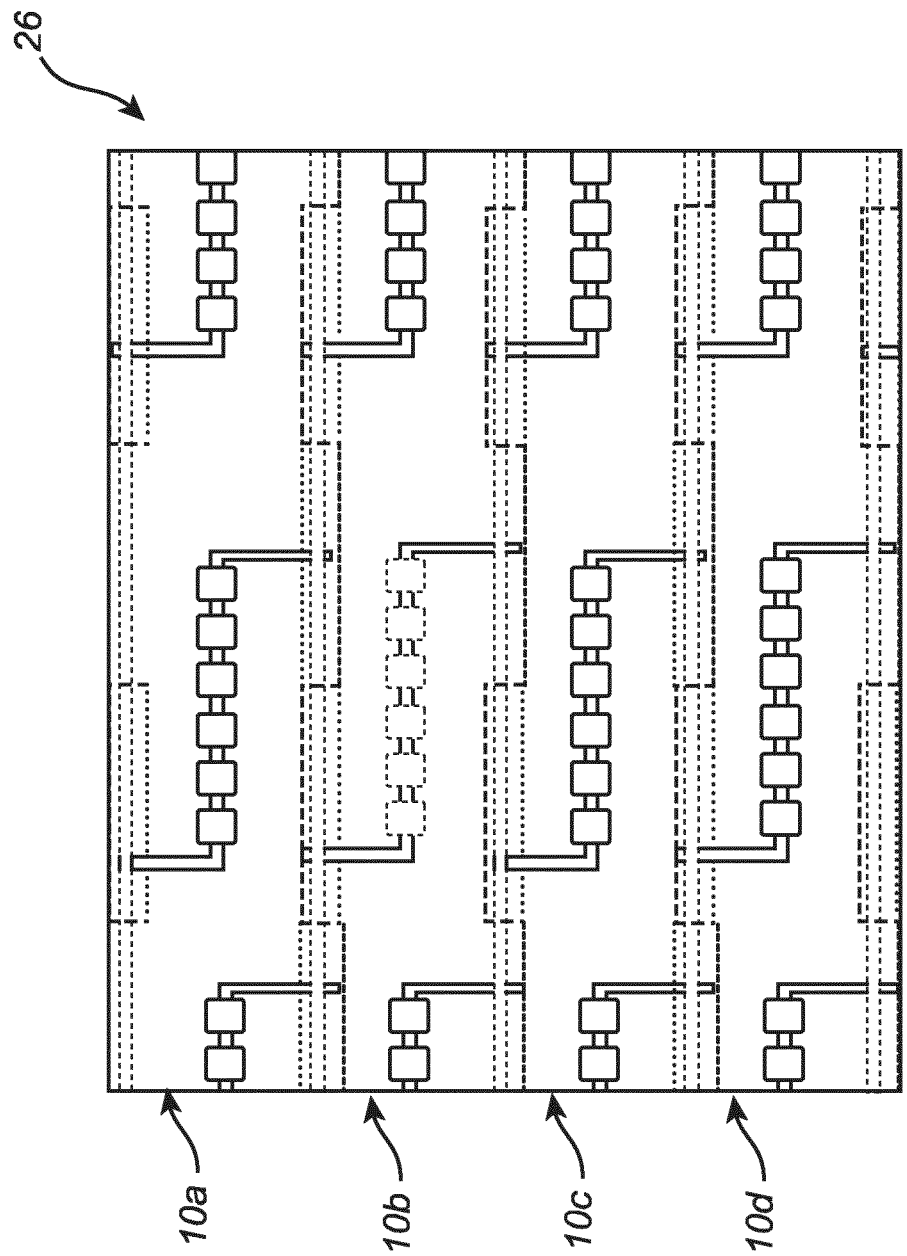

FIG. 3c shows a flexible foil device 26 similar to that of FIGS. 3a-b, but with four flexible foils 10a-d.

Figure 5A:
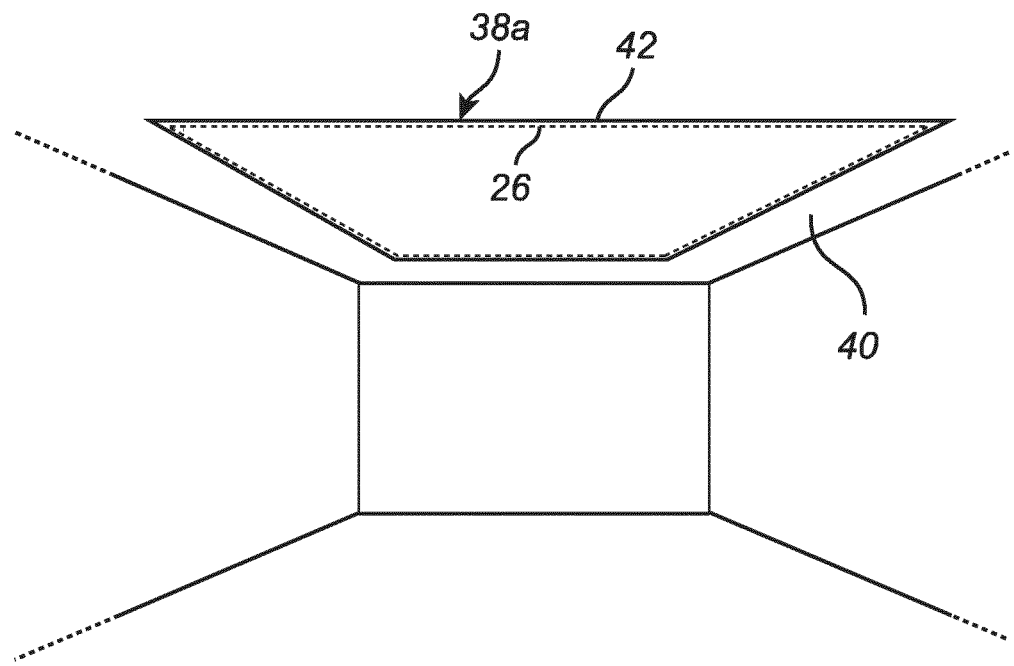
FIGS. 5a-b illustrate lighting panels according to the present invention.
Figure 5B:
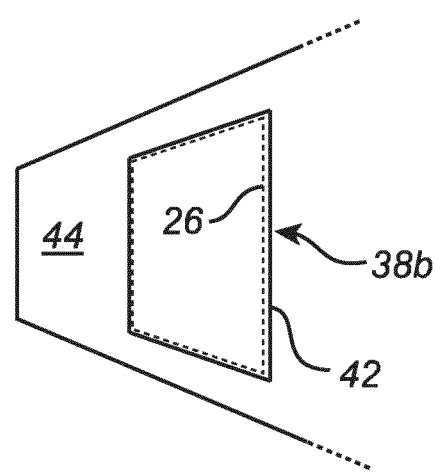

FIGS. 5a-b illustrate lighting panels according to the present invention.

In FIG. 5a, the lighting panel is a ceiling panel 38a mounted in a ceiling 40, though it could alternatively be freehanging or recessed. The ceiling panel 38a comprises a flexible foil device 26 which may be manufactured by the present method. The flexible foil device 26 may here comprise white LEDs. The flexible foil device 26 may be arranged behind a (diffusing) element 42, such as textile. The lighting panel 38a could have a width in the range of 900-3000 mm and a length in the range of 3000-10000 mm, for example. Several lighting panels 38a could be arranged next to each other.

In FIG. 5b, the lighting panel is a luminous textile panel 38b. The luminous textile panel 38b may for example be mounted on a wall 44. The luminous textile panel 38b comprises a flexible foil device 26 which may be manufactured by the present method. The flexible foil device 26 may here comprise RGB LEDs. The flexible foil device 26 may be arranged behind a (diffusing) element 42, such as textile. The lighting panel 38b could have a width in the range of 700-1500 mm and a length in the range of 700-6500 mm, for example.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method for joining at least two flexible foils, wherein the method comprises the steps of:
   providing a first flexible foil having a first row of light emitting diodes and a first set of electrically conductive tracks for supplying current to the first row light emitting diodes;
   providing a second flexible foil having a second row of light emitting diodes and a second set of electrically conductive tracks for supplying current to the second row of light emitting diodes; and
   joining the first flexible foil and the second flexible foil at an overlap of the first flexible foil and the second flexible foil, wherein a metal strip or wire gets embedded between the first flexible foil and the second flexible foil at the overlap, and wherein the metal strip or wire electrically connects to the first and second sets of electrically conductive tracks.

2. A method according to claim 1, wherein the step of joining the first flexible foil and the second flexible foil includes:
   placing the metal strip or wire between the first flexible foil and the second flexible foil; and
   using an apparatus to melt together the first flexible foil and the second flexible foil at the overlap to form a solid connection.

3. A method according to claim 2, wherein the apparatus is a high frequency coil, wherein placing the metal strip or wire between the first flexible foil and the second flexible foil includes pushing the metal strip or wire in between the first flexible foil and the second flexible foil as they move past the high frequency coil, wherein the high frequency coil is used for introducing an eddy current in the metal strip or wire to heat the metal strip or wire, and wherein the heated metal strip or wire melts together the first flexible foil and the second flexible foil at the overlap.

4. A method according to claim 2, further comprising:
   after melting, forming the first flexible foil and the second flexible foil over the metal strip or wire.

5. A method according to claim 1, wherein the first flexible foil and the second flexible foil are joined using at least one of a thermode, ultrasonic welding, hot melt adhesive, glue, batch processing, and reel to reel processing.

6. A method according to claim 1, wherein each of the first and second rows of light emitting diodes extends in a longitudinal direction of the first flexible foil and the second flexible foil, respectively, and wherein the first flexible foil and the second flexible foil are joined at longitudinal overlapping edge portions thereof.

7. A method according to claim 6, wherein the longitudinal overlapping edge portions have cuts forming flaps, and wherein the metal strip or wire is placed between the first flexible foil and the second flexible foil such that a flap of the first flexible foil is above the metal strip or wire, the opposite flap of the second flexible foil is below the metal strip or wire, the longitudinally subsequent flap of the first flexible foil is below the metal strip or wire, and the flap of the second flexible foil opposite the longitudinally subsequent flap of the first flexible foil is above the metal strip or wire.

8. A method according to claim 1, wherein each of the first flexible foil and the second flexible foil has a width (W) in the range of 20-60 cm and a length (L) in the range of 0.5-30 m.

9. A method according to claim 1, wherein each of the first flexible foil and the second flexible foil includes a substrate made of plastic.

10. A method according to claim 1, wherein the light emitting diodes of each of the first flexible foil and the second flexible foil comprises at least at least two groups of light emitting diodes, each group comprising at least one light emitting diode or at least two light emitting diodes connected in series, and wherein each group is electrically connected to the metal strip or wire and to a further strip or wire at an opposite longitudinal edge portion of the respective flexible foil.

11. A method according to claim 1, wherein the light emitting diodes of the first flexible foil and the second flexible foil are arranged in the same direction by means of additional diodes.

12. A method according to claim 1, wherein the metal strip or wire has a greater cross-section than the electrically conductive tracks.

13. A method according to claim 1, wherein the electrically conductive tracks are printed silver circuitry, and wherein the metal strip or wire is made of copper.

14. A flexible foil device comprising:
- a first flexible foil having a first row of light emitting diodes and a first set of electrically conductive tracks for supplying current to the first row of light emitting diodes; and
- a second flexible foils having a second row of light emitting diodes and a second set of electrically conductive tracks for supplying current to the second row of light emitting diodes,
- wherein the first flexible foil and the second flexible foil are joined at an overlap of the first flexible foil and the second flexible foil,
- wherein a metal strip or wire is embedded between the first flexible foil and the second flexible foil at the overlap, and
- wherein the metal strip or wire is electrically connected to the first and second sets of electrically conductive tracks.

15. A lighting panel comprising a flexible foil device according to claim 14.

* * * * *